United States Patent [19]
Nitta et al.

[11] Patent Number: 5,057,244
[45] Date of Patent: Oct. 15, 1991

[54] TRANSPARENT, ELECTRICALLY CONDUCTIVE FILM

[75] Inventors: Shoji Nitta, Gifu; Yukio Ide, Mishima, both of Japan

[73] Assignee: Ricoh Company, Ltd., Tokyo, Japan

[21] Appl. No.: 816,685

[22] Filed: Jan. 6, 1986

Related U.S. Application Data

[63] Continuation-in-part of Ser. No. 661,379, Oct. 16, 1984, abandoned.

[30] Foreign Application Priority Data

Oct. 20, 1983 [JP] Japan .................. 58-195181

[51] Int. Cl.$^5$ ............................................. H01C 13/00
[52] U.S. Cl. ............................. 252/501.1; 252/500; 252/502; 252/503; 252/504; 252/516; 252/518

[58] Field of Search ................. 427/164, 165; 428/411.1, 432, 698, 699, 704; 204/192 P; 136/256; 252/501.1, 500, 503, 518, 504, 516, 502

[56] References Cited

U.S. PATENT DOCUMENTS 4,387,387  7/1983  Yamazaki ........................ 357/30
4,673,589  6/1987  Standey ........................ 252/501.1

*Primary Examiner*—Josephine Barr
*Attorney, Agent, or Firm*—Cooper & Dunham

[57] ABSTRACT

A transparent, electrically conductive film suitable for use as a transparent electrode in various optical devices is provided. The film comprises a first element selected from a first group consisting of Sn, Pb, and In, at least one second element selected from a second group consisting of N, O, S, and H, and C.

6 Claims, 7 Drawing Sheets

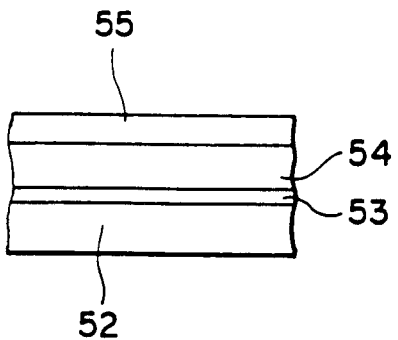
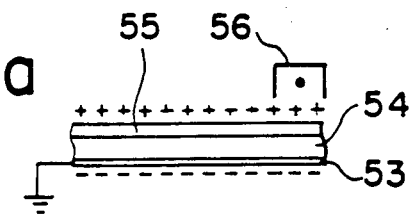
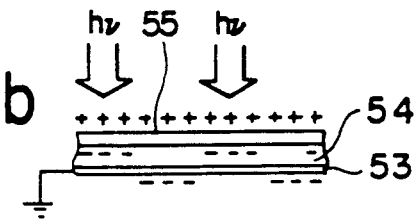
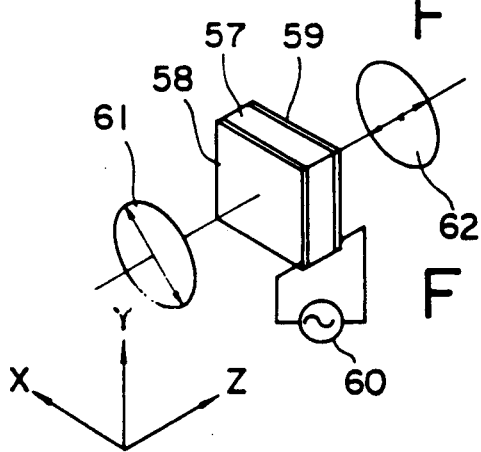
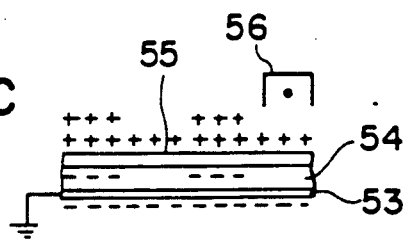
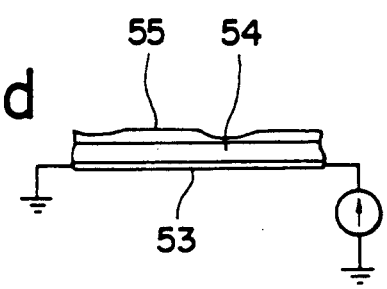
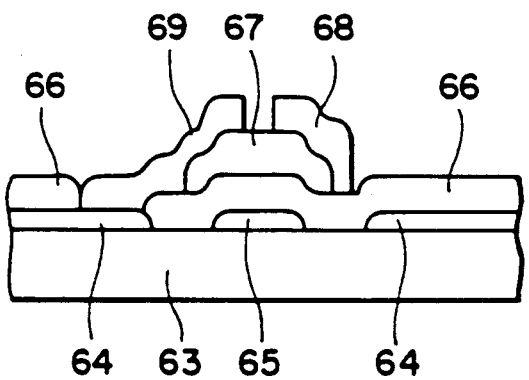

TRANSPARENT, ELECTRICALLY CONDUCTIVE FILM

CROSS-REFERENCE TO RELATED APPLICATIONS

This is a continuation-in-part of application Ser. No. 661,379, filed Oct. 16, 1984, now abandoned.

BACKGROUND OF THE INVENTION

1. Field of the Invention

This invention relates to a transparent, electrically conductive film, and, in particular, to a transparent, electrically conductive film which is suitable for use as a transparent electrode in various optical devices, such as solar cells, optical image sensors sand liquid crystal display panels.

2. Description of the Prior Art

In prior art optical devices, such as solar cells, optical image sensors and liquid crystal display panels, an oxide-family transparent, electrically conductive film, such as $In_2O_3$ and $SnO_2$, has been formed on a transparent substrate of glass or polymer as a transparent electrode. On the other hand, research and development in optical devices using amorphous is silicon (hereinafter, also referred to as a-silicon) has been carried out very actively in recent years, and a-silicon optical devices, such as a-silicon solar cells, a-silicon optical image sensors, and display units using a-silicon as a light-emitting material, have become commercially available at least partly.

However, when use was made of an a-silicon family material, prior art transparent electrodes typically had a problem of deterioration of interface condition. That is, when manufacturing a film of a-silicon, it is common practice to rely on the glow discharge decomposition method using mono-silane ($SiH_4$) as a source material. In this case, however, oxygen atoms contained in the above-mentioned oxide-family transparent, electrically conductive film formed as a transparent electrode on the substrate react with hydrogen radicals generated in plasma, thereby forming $H_2O$. The production of $H_2O$ provides effects on the adhesively and/or surface state of a-silicon material, and thus there is a possibility that the interface condition of the resultant transparent electrode is significantly deteriorated. Moreover, even if a transparent electrode is formed, at the interface between $In_2O_3$ and a-Si:H, for example, In, O, and Si diffuse from one another to form new compounds, such as $SiO_2$, thereby hindering obtainment of an excellent interface, which could provide significant adverse effects on device characteristics.

As described above, prior art transparent electrodes were typically comprised of an oxide of semiconductor material, such as ITO (Indium Tin Oxide), $SnO_2$, $SnO_2$:Sb, and $TiO_2/Ag/TiO_2$. However, several disadvantages are generally brought about by using such an oxide material in forming a transparent electrode. For example, glass is typically used as a base plate or substrate on which a desired transparent electrode is formed and alkali ions, such as $Na^+$ and $K^+$, are easily diffused into the transparent electrode formed on the glass substrate thereby forming acceptor levels therein. As a result, donors are captured by these acceptor levels to lower the conductivity of the transparent electrode, thereby deteriorating device characteristics. In addition, such reduction in conductivity occurs locally so that irregularities are formed in the conductivity of the transparent electrode, thereby forming a non-uniform characteristic. This problem becomes prominent when a transparent electrode of larger area is to be formed, and resulting devices will be poor in reliability and durability.

In particular, in the case of an oxide family transparent electrode, it is rather chemically unstable and it gradually becomes decomposed, for example, due to water content in the atmosphere so that its conductivity becomes lower, thereby deteriorating the characteristics required for an intended optical device. As described previously, in the case of an a-Si:H solar cell, for example, when a transparent and electrically conductive film is formed in the plasma decomposition atmosphere of $SiH_4$, since it is placed in a reducing atmosphere, an oxide family transparent electrode, such as ITO, is inevitably reduced. As a result, reduced metal indium is diffused into the film of a-Si:H, thereby deteriorating the characteristics as a solar cell. Such an argument generally holds true for other oxide family transparent electrodes.

SUMMARY OF THE INVENTION

It is therefore a primary object of the present invention to obviate the disadvantages of the prior art as described above and to provide an improved film of transparent and electrically conductive material.

Another object of the present invention is to provide a novel transparent, electrically conductive film which is particularly suitable for use as a transparent electrode in various devices.

A further object of the present invention is to provide an improved optical device reliable and stable in operation.

A still further object of the present invention is to provide a transparent, electrically conductive film which is excellent in interface condition and which causes no deterioration in characteristics even when used in such optical devices as solar cells, optical image sensors and display units, using a-Si material.

Other objects, advantages and novel features of the present invention will become apparent from the followed detailed description of the invention when considered in conjunction with the accompanying drawings.

BRIEF DESCRIPTION OF THE DRAWINGS

FIG. 10 is a schematic illustration showing an information recording medium embodying the present invention;

FIGS. 11a through 11d are schematic illustrations showing several steps in recording information on the recording medium of FIG. 10;

FIG. 12 is a schematic illustration showing an optical modulator embodying the present invention;

FIG. 13 is a schematic illustration showing a thin-film transistor device embodying the present invention;

DESCRIPTION OF THE PREFERRED EMBODIMENTS

Figure 1:
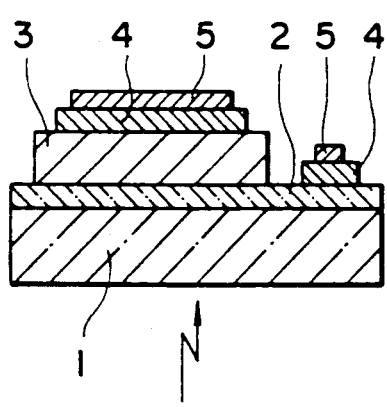
FIG. 1 is a schematic illustration showing a photovoltaic type image sensor embodying the present invention.

In accordance with the present invention, there is provided a transparent, electrically conductive film which is particularly useful for use as a transparent electrode in various types of optical devices. In accordance with the principle of the present invention, elements, preferably In, Sn, Tl, and Pb, are selected from groups III and IV of the periodic table in order to provide electrical conductivity. On the other hand, in order to provide transparency, or light-transmission characteristics, since it is necessary to broaden the optical band gap. At least C should be contained, and it is preferable if one of N, S, and O is contained. It is more preferable if hydrogen is contained in the film because it can provide a reducing atmosphere. In this manner, in the preferred embodiment of the present invention, a transparent, electrically conductive film is produced from an element selected from either group III or group IV of the periodic table, C, and an element selected from the group consisting of N, O, S, and H, using an appropriate film forming technique.

For example, using Sn as a selected element from group IV of the periodic table, C, and H as a selected element from the group consisting of N, S, O, and H, there may be obtained a film of $Sn_xC_{1-x}$:H, which is transparent and electrically conductive. In forming such a film, use may be made of stannane ($SnH_4$) and $C_2H_4$ and $H_2$ as raw material gases, and film forming techniques, such as plasma CVD (glow discharge decomposition method), HOMOCVD and light-induced CVD methods, may be employed. In an alternative method, a metallo-organic gas, such as tetramethyltin ($Sn(CH_3)_4$), may be used, and a film may be formed by using such a method as, for example, MOCVD, plasma CVD, HOMOCVD and light-induced CVD. In a further alternative method, the film of the present invention may be formed by a reactive sputtering method using Sn as a target in an atmosphere of Ar—$CH_4$ or $C_2H_2$—$H_2$. Furthermore, there is a further film-forming method which is a combination of vacuum deposition of Sn and electrical discharge of $Ch_4$, $H_2$. These film-forming methods are all well known to one skilled in the art.

It is to be noted that a substrate or base plate on which a transparent, electrically conductive film of the present invention is formed may be comprised of any desired material and it is typically comprised of glass and polymer. Moreover, in order to control the conductivity of the present transparent and conductive film, an additive, such as B or P, together with N, O, or S, if necessary, may be added by an appropriate amount, if desired.

As may be understood, the transparent and conductive film of the present invention is highly reductive as compared with the prior art films, and, thus, even if it is used in a plasma (in particular, in the glow discharge decomposition method involving $SiH_4$ and $H_2$ or in reactive sputtering in $H_2$), no $H_2O$ is produced at the interface, thereby ensuring excellent adhesive strength. Thus, when applied as a transparent electrode in an optical device using a-Si material, it may contribute to improve the device quality and yield in manufacture.

As described above, in accordance with the principle of the present invention, there is provided a transparent, electrically conductive film including C, a first element selected from the group consisting of Sn, Pb, and In and at least one second element selected from the group consisting of N, O, S, and H. It will now be described regarding several specific optical devices to which the principle of the present invention is applied.

Figure 2:
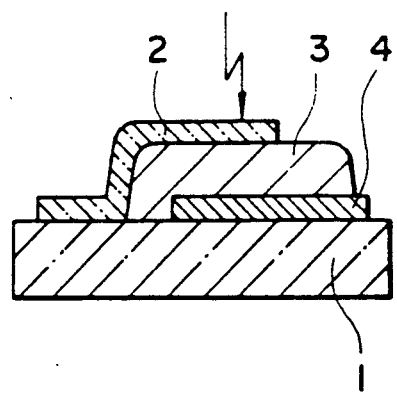
FIG. 2 is a schematic illustration showing a sandwich type image sensor embodying the present invention.

FIG. 1 shows a photovoltaic type optical image sensor constructed in accordance with one embodiment of the present invention. As shown, the sensor includes a glass substrate 1, a transparent and conductive film 2 formed across the top surface of substrate 1 and a photoconductive layer 3 formed on the film 2 in a desired pattern. A back side electrode 4 is formed on the film 2 and another back side electrode 4 is also formed on the photoconductive film 3. The entire structure is supported on a lead frame 5. In the illustrated embodiment, since light is irradiated from bottom as shown by the arrow, the electrode film 2 must be transparent. FIG. 2 also shows a photovoltaic type optical image sensor having an inverted structure as compared with the structure of FIG. 1, and, thus, light is irradiated from the top in this embodiment as shown. It is to be noted that in forming the photoconductive layer 3, use may be made of a-Si:H, CdS, CdSe, or the like.

In a prior art optical image sensor having such a structure, use in typically made of a metal oxide transparent electrode film, such as ITO. However, if the photoconductive layer 3 is to be formed from a-Si:H, the layer 3 is formed by decomposing SiH$_4$ gas using the plasma CVD method. In this case, the transparent electrode film 2 formed on the glass plate 1 is exposed to plasma atmosphere. Under the circumstances, if the electrode film 2 is made from a metal oxide, numerous hydrogen radicals are created in the plasma and they react with the oxygen present in the electrode film, thereby causing a reduction in electrical conductivity. Even if the photoconductive layer 3 is to be formed from CdS, CdSe, or the like, alkali ions, e.g., Na$^+$ and K$^+$, are diffused into the metal oxide electrode film from the glass substrate 1, thereby lowering the electrical conductivity of metal oxide electrode film.

On the other hand, in accordance with the present embodiment, the transparent electrode film 2 is comprised of a reducing material which allows transmission of light therethrough. In the preferred embodiment, the transparent electrode film 2 includes C, a first element selected from a first group consisting of Sn, Pb, and In and at least one second element selected from a second group consisting of N, O, S, and H. Accordingly, the present transparent electrode film 2 may include the following composites as a basic material.

$Sn_xC_{1-x}$, $Sn_xC_yO_z$, $Pb_xC_{1-x}$, $Pb_xC_yO_z$, $Pb_xC_yS_z$, $In_xC_{1-x}$, $In_xC_yN_z$, etc.

It is to be noted that in any of the above compounds, the values of x, y, and z are larger than zero but smaller than unity while satisfying the relation of $x+y+z=1$. Preferably, hydrogen is added to the above compounds to define hydrides such as, $Sn_xC_{1-x}$:H, $Sn_xC_yO_z$:H, $Pb_xC_{1-x}$:H, $Pb_xC_yS_z$:H, $In_xC_{1-x}$:H, $In_xC_yH_z$:H, $I_xC_yO_z$:H, etc.

In order to control the electrical conductivity of a film comprising an element selected from group IV, such as Sn or Pb, an element selected from group IIIa of the periodic table, including B, Al, Ga, In, and Tl, or an element selected from group Va of the periodic table, including N, P, As, Sb, and Bi, may be added as an impurity, if desired, in a range between 1 ppm and 20 atomic %. On the other hand, in order to control the electrical conductivity of a film comprising an element selected from group III, such as In or Tl, an element selected from group II, such as Zn, Cd, or Hg, may be added as an impurity, and, additionally, an element selected from group IV, such as Si, Ge, Sn, or Pb, may also be added, if desired. The amount of content of such an additive ranges between 1 ppm and 20 atomic %. It is to be noted that, in each case, a halogen element, including F, Cl, Br, and I, may also be additionally added, if desired.

With such a transparent electrode film 2, even if the photoconductive film 3 is formed as an a-Si:H film according to the plasma CVD method using silane gas, since a non-reactive reducing atmosphere with hydrogen radicals is created, reduction of electrical conductivity of the transparent electrode film 2 may be minimized. Importantly, the alkali ions drifting from the glass substrate 1 are also prevented from easily diffusing into the electrode film 2 so that the electrode film 2 can remain high in electrical conductivity as well as in durability.

As described above, in accordance with this embodiment of the present invention, the transparent electrode film 2 is prevented from lowering its electrical conductivity due, for example, to introduction of alkali ions from the adjacent layer so that the resultant transparent electrode film 2 is high in durability and stability. As a result, even if the device is made to have a larger surface area, no irregularities are created in the level of conductivity so that a uniform characteristic may be obtained across the entire surface. Besides, the electrical conductivity and light transmissivity of transparent electrode film 2 are enhanced, thereby increasing the overall photoelectric conversion efficiency as an optical image sensor.

As mentioned previously, the transparent electrode film 2 may be fabricated by any well-known film forming technique and the preferred techniques include CVD, plasma CVD, light-induced CVD, and reactive sputtering methods. In particular, the plasma CVD method is most preferred. When the transparent electrode film 2 is manufactured by the plasma CVD method, an organo-metallic compound, such as Sn(CH$_3$)$_4$, Sn(C$_2$H$_5$)$_4$, Sn(C$_3$H$_7$)$_4$, Sn(C$_4$H$_9$)$_4$, Pb(C$_2$H$_5$)$_4$, Pb(C$_4$H$_9$)$_4$, In(CH$_3$)$_3$, In(C$_2$H$_5$)$_3$, In(C$_3$H$_7$)$_3$ and In(C$_4$H$_9$)$_3$, is introduced while being diluted by an appropriate carrier gas, such as He, Ar, H$_2$, and N$_2$, while at the same time introducing at least one other gas selected from a carbon-containing gas, such as a hydrocarbon family gas exemplified by CH$_4$, C$_2$H$_6$, C$_3$H$_8$, C$_2$H$_4$, and C$_2$H$_2$, and, if N, O, and S are to be contained, a nitrogen-containing gas, such as N$_2$ and NH$_3$, a sulfur-containing gas, such as H$_2$S, and an oxygen-containing gas, such as O$_2$, CO$_2$, CO, NO, NO$_2$, and N$_2$O. It is to be noted that formation of a hydride such as $Sn_xC_{1-x}$:H is assumed here. The transparent electrode film 2 is preferably formed to the thickness of 50 to 10,000 angstroms.

Figure 3:
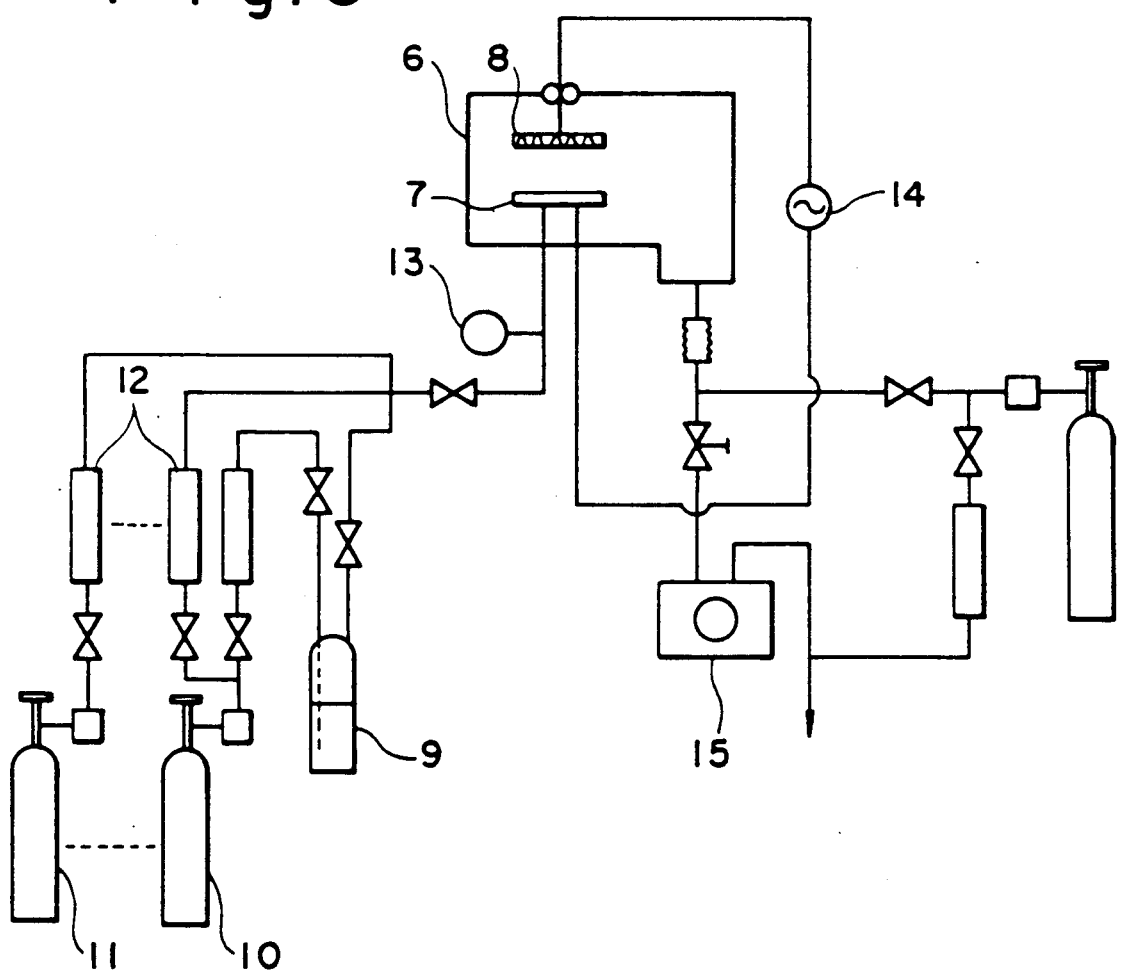
FIG. 3 is a schematic illustration showing a plasma CVD system.

FIG. 3 illustrates a plasma CVD system for implementing the plasma CVD method for forming the transparent electrode film 2. As shown, the system includes a reaction chamber 6 and a pair of opposed electrodes 7, 8 disposed inside of the reaction chamber 6 with the glass substrate 1 being supported on the electrode 8. An organo-metallic compound contained in a bubbler 9 is introduced into the reaction chamber 6, together with a carrier gas from a gas reservoir 10 and a carbon-containing gas from another gas reservoir 11. The system also includes flow meters 12 and a pressure gauge 13. An RF voltage is applied between the opposite electrodes 7 and 8 from a RF voltage source 14 so that glow discharge takes place between the electrodes 7 and 8 to create a plasma therebetween in which the raw material gas introduced from the bubbler 9 is decomposed, thereby causing the transparent electrode film 2 to form on the glass substrate 1. During this process, the reaction chamber 6 is evacuated by a vacuum pump 15 and maintained at a predetermined negative pressure.

Incidentally, the optical image sensor thus formed may be used in various devices such as facsimile machines, OCRs, cameras, television receivers, rotary encoders, and robots.

Figure 4:
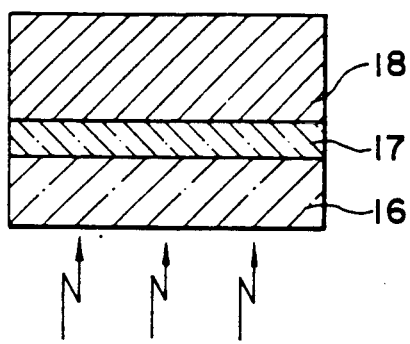
FIG. 4 is a schematic illustration showing the structure of an electrophotographic photosensitive member embodying the present invention.

Referring now to FIG. 4, there is shown an electrophotographic photosensitive member constructed in accordance with a further embodiment of the present invention. As shown, the photosensitive member includes a transparent support 16 of polyester film, a transparent conductive film 17 formed on the support 16, and a photoconductive layer (PVK/TNF) 18 formed on the film 17. Also in this embodiment, the transparent, conductive film 17 is formed as a reductive film similar to the transparent, conductive film 2 in the previous embodiment.

With this type of photosensitive member, since light for image exposure and removal of remaining charge is irradiated from the side where the transparent support 16 is provided, it is high in cleaning characteristic and durability. In the case of a photosensitive member for use in an electrophotographic process, it is required to be significantly large in surface area and to have a uniform characteristic across the entire surface. If use is made of a prior art transparent, conductive film of metal oxide, since it is chemically unstable and liable to suffer deterioration of its electrical conductivity, thereby making the conductive characteristic non-uniform across the entire surface, it is difficult to obtain a larger-surfaced photosensitive member uniform in characteristic across the entire surface. On the other hand, in the present embodiment having the transparent, conductive film 17, which is comprised, for example, of $Sn_xC_{1-x}$:H, there is no possibility of occurrence of deterioration in electrical conductivity and a uniform characteristic can be obtained across the entire surface.

In the case where the photosensitive member is fabricated in the form of a belt, it receives a significant mechanical stress during operation. However, since the present photosensitive member is far superior in stress-resistant characteristic than a prior art transparent, conductive film of metal oxide, the present embodiment has an increased durability.

Figure 5:
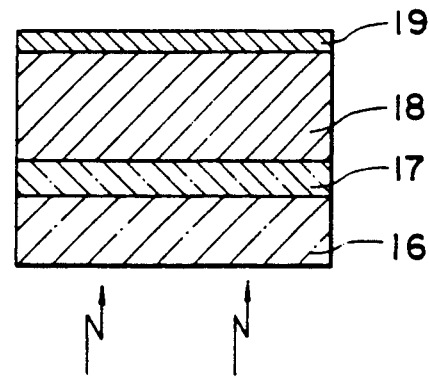
FIG. 5 is a schematic illustration showing a modified structure from that of FIG. 4.

The photoconductive layer 18 may be formed from copper phthalocyanine, pyrylium, or amorphous-Si. If use is made of a-Si to form the layer 18, when a transparent, conductive film is formed on the layer 18 from a metal oxide, if only oxygen is contained and no C is contained in the conductive film, it diffuses into the photoconductive layer 18 so that the photoconductive characteristic becomes deteriorated. On the other hand, in accordance with the present embodiment, diffusion of oxygen into the photoconductive layer 18 does not take place so that deterioration of photoconductive characteristic due to diffusion of oxygen does not occur. FIG. 5 shows a modified structure in which a protective layer 19 is formed on the photoconductive layer 18.

The illustrated photosensitive member may be advantageously used in copiers, laser printers, LED printers, liquid-crystal printers, and electrophotographic display devices.

Figure 6:
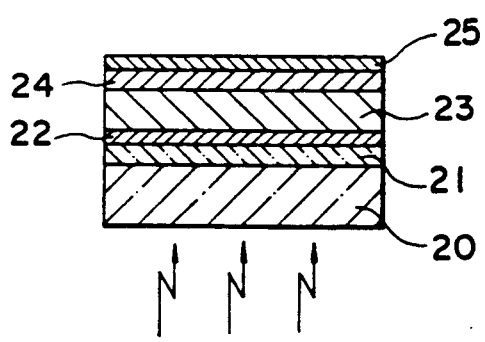
FIG. 6 is a schematic illustration showing a solar cell or battery embodying the present invention.

Referring now to FIG. 6, there is shown a further embodiment of the present invention when applied to a solar cell. The specific structure shown in FIG. 6 is an a-Si solar cell and it includes a glass substrate 20, a transparent electrode 21 formed on the substrate 20, a P-type a-Si:H layer 22 formed on the electrode 21, an i-type a-Si:H layer 23 formed on the layer 22, an N-type a-Si:H layer 24 formed on the layer 23, and an Al electrode 25 formed on the layer 24. This structure is characterized by having the transparent, conductive electrode layer 21 which is similar in composition and method of manufacture to the transparent, conductive film 2 of the previously described embodiment. Thus, the electrode film 21 is formed as a reductive, transparent, and conductive film.

As a result, as compared with a typical prior art transparent, conductive film of metal oxide such as ITO used to form a transparent electrode film, the present embodiment having the transparent electrode 21 is superior not only in photoelectric conversion efficiency but also in durability. After manufacture of a solar cell having the structure shown in FIG. 6, the interface between the transparent electrode 21 and the a-Si layer 22 has been examined by the Auger electron spectroscopy method which indicated very little diffusion of the basic element, such as Sn, Pb, or In forming the transparent electrode 21, into the a-Si layer 22-24. Moreover, the amount of diffusion of alkali ions, such as $Na^+$, from the glass substrate 20 into the transparent electrode 21 has also been found to be very little so that there has been found virtually no deterioration of electrical conductivity of the electrode 21.

It is to be noted that although the above description has been made with respect to an a-Si solar cell, the present invention should not be limited only to this and it may be equally applied to other types of solar cells. The solar cell having the structure of the present invention may be applied advantageously to photoelectric conversion devices as well as to optical communication devices.

Using the system shown in FIG. 3, a transparent and electrically conductive film low in electrical resistance and high in light transmission as well as chemical stability can be provided. Such a film may be formed on a substrate, such as a silicon wafer, or a flexible tape or film, such as polyethylene terephthalate, for example, of 100 microns thick. Such a film is formed on a support body, such as a substrate or a flexible carrier, and it is characterized by comprising at least Sn, O, and C. Preferably, the composition of such a film is expressed by $Sn_xO_yC_z$ where $x+y+z=1$ with $x=0.3$ to $0.7$, $y=0.2$ to $0.69$ and $z=0.01$ to $0.2$. Such a film also preferably includes at least one element selected from group III, such as B, Al, Ga, In, and Tl, or from group V, such as N, P, As, Sb, and Bi. Such a film can be manufactured, for example, according to the following process using the system shown in FIG. 3.

A substrate of glass, silicon wafer or the like, which has been previously washed and dried, is mounted on the upper electrode 8 inside of the reaction chamber 6. Then, the interior of the chamber 6 is once evacuated to $10^{-3}$ torr, and, thereafter, the substrate is heated to and maintained at 150° C. With the introduction of Ar gas at the flow rate of 20 SCCM, the pressure is set at 0.3 torr by operating the valve, and then RF power of 50 W at 13.56 MHz is supplied to carry out plasma discharge for about 10 minutes, thereby effecting the cleaning of the substrate and the electrodes. Once the discharge and the introduction of Ar are stopped and the interior of the chamber 6 is once again evacuated to $10^{-3}$ torr or below. The reaction gases are introduced into the chamber 6 under the following conditions.

| $Sn(CH_3)_4$ | 40 mg/min | 0.45 torr |
|---|---|---|
| Ar | 20 SCCM | 0.45 torr |
| $O_2$ | 15 SCCM | 0.45 torr |
| $C_2H_4$ | 5 SCCM | 0.45 torr |
| $PH_3$ (1,000 ppm)/Ar | 10 SCCM | 0.45 torr |

Then, when the flow rate and the pressure are stabilized, the RF energy at 10 of 13.56 MHz is supplied for reaction to take place for 20 minutes. The resulting film was non-colored and transparent and it had the transmissivity of 90% or more for 400 to 800 nm. The film had the thickness of approximately 1,000 angstroms. The surface resistance when measured by the four electrode method indicated approximately 100 ohms/square. It was also found that the film exhibited excellent characteristics for etching and weather-resistance.

In accordance with a modification of the embodiment just described above, there is provided a film which comprises at least Sn, O, C, and F. Preferably, this film has the composition which can be expressed as $(Sn_xO_yC_z)_{1-m}F_m$, where $x+y+z=1$ with $x=0.3$ to $0.7$, $y=0.2$ to $0.69$, $z=0.01$ to $0.2$ and m being larger than zero but equal to or smaller than $0.4$. Such a film can be manufactured in accordance with a process similar to the one described above excepting the reaction gases to be supplied to the chamber 6, i.e., in the present embodiment,

| | | |
|---|---|---|
| Sn(CH$_3$)$_4$ | 50 mg/min | 0.35 torr |
| Ar | 20 SCCM | 0.35 torr |
| O$_2$ | 10 SCCM | 0.35 torr |
| CH$_4$ | 5 SCCM | 0.35 torr |
| C$_2$F$_6$ | 5 SCCM | 0.35 torr |
| PH$_3$ (1,000 ppm)/Ar | 10 SCCM | 0.35 torr. |

In accordance with a further modification, there is provided a film which comprises at least Sn, O, C, H, and halogen. Preferably, this film has the composition which can be expressed by $(Sn_xO_yC_z)_{1-l}(H_{1-m}R_m)_l$, where R is halogen, such as F, Cl, Br, or I, and $x+y+z=1$ with $x=0.3$ to $0.7$, $y=0.2$ to $0.69$, $z=0.01$ to $0.2$, l being larger than zero but equal to or smaller than $0.4$, and m being equal to or larger than $0.01$ but equal to or smaller than $0.99$. Such a film can also be manufactured similarly as described above; however, in the present embodiment, the reaction gases to be supplied to the chamber 6 are as follows:

| | | |
|---|---|---|
| Sn(CH$_3$)$_4$ | 50 mg/min | 0.33 torr |
| Ar | 20 SCCM | 0.33 torr |
| O$_2$ | 10 SCCM | 0.33 torr |
| C$_2$H$_4$ | 5 SCCM | 0.33 torr |
| C$_2$F$_6$ | 5 SCCM | 0.33 torr |
| PH$_3$ (1,000 ppm)/H$_2$ | 10 SCCM | 0.33 torr. |

In accordance with a still further modification, there is provided a film which comprises at least Sn, O, C, and H. Preferably, this film has the composition which can be expressed by $(Sn_xO_yC_z)_{1-m}H_m$, where $x+y+z=1$ with $x=0.3$ to $0.7$, $y=0.2$ to $0.69$, $z=0.01$ to $0.2$, and m being larger than zero but approximately equal to or smaller than $0.4$. Such a film can also be manufactured similarly as described above; however, in the present embodiment, the reaction gases to be supplied to the chamber 6 are as follows:

| | | |
|---|---|---|
| Sn(CH$_3$) | 50 mg/min | 0.4 torr |
| Ar | 20 SCCM | 0.4 torr |
| O$_2$ | 10 SCCM | 0.4 torr |
| C$_2$H$_4$ | 5 SCCM | 0.4 torr |
| PH$_3$ (1,000 ppm)/H$_2$ | 10 SCCM | 0.4 torr. |

In accordance with a still further modification, there is provided a film which comrises at least Sn, O, C, and Cl. Preferably, this film has the composition which can be expressed by $(Sn_xO_yC_z)_{1-m}Cl_m$, where $x+y+z=1$ with $x=0.3$ to $0.7$, $y=0.2$ to $0.69$, $z=0.01$ to $0.2$, and m being larger than zero but approximately equal to or smaller than $0.4$. Such a film can also be manufactured similarly as described above; however, in the present embodiment, the reaction gases to be supplied to the chamber 6 are as follows:

| | | |
|---|---|---|
| Sn(CH$_3$)$_4$ | 40 mg/min | 0.42 torr |
| Ar | 20 SCCM | 0.42 torr |
| O$_2$ | 10 SCCM | 0.42 torr |
| CH$_4$ | 5 SCCM | 0.42 torr |
| Cl$_2$ | 3 SCCM | 0.42 torr |
| PH$_3$ (1,000 ppm)/Ar | 5 SCCM | 0.42 torr. |

Figure 7:
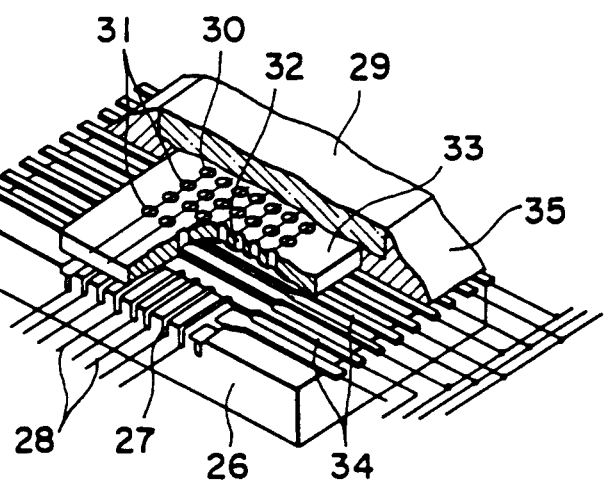
FIG. 7 is a partially cut-away, perspective view showing the structure of a d.c. plasma display device embodying the present invention.
Figure 8:
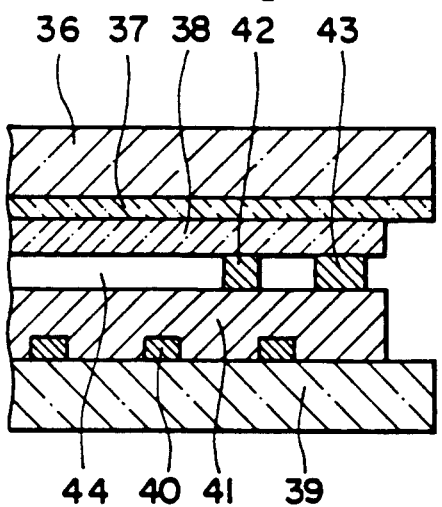
FIG. 8 is a partially cut-away, perspective view showing the structure of an a.c. plasma display device embodying the present invention.

Referring now to FIGS. 7 and 8, there are shown plasma display devices constructed in accordance with still further embodiments of the present invention. FIG. 7 illustrates a d.c. type plasma display device and FIG. 8 illustrates an a.c. type plasma display device.

First, as shown in FIG. 7, the d.c. type plasma display device includes a back side glass plate 26, which is formed with scanning grooves 27 at one surface which are spaced apart from one another and extend in a predetermined direction, and elongated scanning anodes 28 disposed at the bottom of respective scanning grooves 27. The display device also includes a front glass 29 which, in turn, includes a transparent, conductive film 30 as display anode, which defines an individual display cell 31. The device also includes a cell sheet 33 made from a photosensitive glass plate approximately 1 mm thick formed by etching a plurality of electrical discharge holes 32 therethrough and cathodes 34 extending perpendicular to the anodes 28 and sandwiched between the plates 26 and 33. A sealing material 35 comprised, for example, of low melting point material, such as pyroceram, is provided around the periphery to seal the entire structure.

FIG. 8 illustrates an a.c. type plasma display unit constructed in accordance with a still further embodiment of the present invention, and it includes a front glass plate 36, a transparent, conductive film 37 formed as an electrode on the plate 36 and a dielectric layer 38 formed on the electrode film 37. The unit also includes a rear glass plate 39, electrodes 40 formed on the plate 39 and a dielectric cover layer 41 formed on the electrodes 40 and the plate 39. The plates 36 and 39 are placed opposite to each other with a spacer 42 sandwiched between the dielectric layers 38 and 41, and a sealing material 43, such as powder glass, is applied to seal the space defined between the oppositely arranged composite structures. Thereafter, a desired gas 44 is injected in the space thus defined. If desired, a protective layer may be formed on either one or both of the dielectric layers 38 and 41. In the illustrated embodiment, the gap between the glass plates 36 and 39 is approximately 100 microns and the gas, such as Ne or Ne+Xe, is injected at a pressure of approximately 300 Torr.

With the structure, when a voltage is applied externally, the applied voltage is distributed across the dielectric layers 38, 41 and the gap for electrical discharge. Since an a.c. voltage is applied to this structure, electrical discharge takes place intermittently in the gap so that light is emitted intermittently in accordance therewith.

In accordance with the present invention, the transparent electrode film 30 in the case of the d.c. type unit shown in FIG. 7 and the transparent electrode film 37 in the case of the a.c. type unit shown in FIG. 8 are comprised of a reductive, transparent, and conductive film in a manner similar to the transparent electrode film 2 of the previously described embodiment.

Accordingly, in the d.c. type unit of FIG. 7, since the transparent electrode film 30 is exposed to the electrical discharge holes 32, if it is comprised of a prior art transparent electrode film, such as ITO, its characteristic deteriorates due to the effects imparted by the plasma. However, such a deterioration can be prevented from occurring by structuring the film 30 according to the teachings of the present invention. In addition, when constructed according to the teachings of the present invention, no diffusion of alkali ions from the glass substrate to the electrode film takes place, and the electrode film may maintain its electrical conductivity at high levels. Furthermore, since the electrode film 30 may be increased in conductivity and light transmitivity, light emitting efficiency as a display unit may also be enhanced. These arguments hold equally true for the a.c. type display unit of FIG. 8.

The illustrated plasma display units may be applied to television receivers, measuring devices, display panels, POS terminals, vehicle carrier display devices, aerial control devices, radars, and machine tools.

Figure 9:
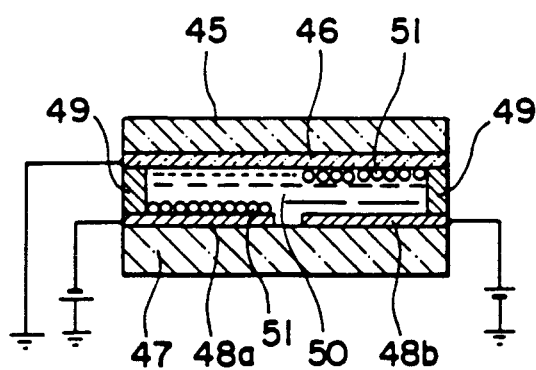
FIG. 9 is a schematic illustration showing an electrophoretic display device embodying the present invention.

Referring now to FIG. 9, there is shown an electrophoretic display unit constructed in accordance with a still further embodiment of the present invention. The structure illustrated in FIG. 9 relates to an electrophoretic display unit using individual particles. As shown, the display unit includes a glass plate 45 on which a transparent electrode film 46 is formed and a substrate 47 on which a plurality of electrodes 48a and 48b are formed, for example, from Al, which are placed opposite to each other with a spacer 49 sealingly sandwiched therebetween. The sealed space thus defined is filled, for example, with a black organic dielectric medium 50, together with white electrophoretic particles 51, such as $TiO_2$ and ZnO particles. With this structure, a voltage is applied between the transparent electrode film 46 and the electrodes 48a or 48b so that the electrophoretic particles 51 are electrostatically attracted either to the transparent electrode film 46 or to the electrode 48a and/or 48b depending on the direction of the electric field created therebetween. In the illustrated embodiment, the electrophoretic particles 51, white in color, are partly attracted to the electrodes 48a and partly to the transparent electrode film 46 so that, when viewed from top, the left-half portion displays black in color and the right-half portion displays white in color.

Also in the present embodiment, the transparent electrode film 46 is comprised of a reductive, transparent, and conductive film, which is similar in composition as well as in manufacture to the transparent electrode film 2 of the previously described embodiment. It is to be noted that although the particles used in the above-described embodiment are of the same kind, they may include two or more different kinds of particles. The illustrated electrophoretic display unit may be applied to photoelectric conversion devices and optical communication devices.

Referring now to FIGS. 10 and 11, a description will be given with respect to an information recording member constructed in accordance with a still further embodiment of the present invention. As shown in FIG. 10, the present recording member includes a glass substrate 52, a transparent electrode film 53, a photoconductive layer 54, and a thermoplastic resin layer 55 formed one on top of another in the order mentioned. The photoconductive layer 54 is preferably comprised of such a material as polyvinyl carbazol/trinitrofluorene complex, copper phthalocyanine, amorphous silicon hydride, selenium/tellurium, and arsenic/selenium. On the other hand, the thermoplastic resin layer 55 is preferably comprised of such a material as polyethylene, polypropylene, polystyrene, and polyvinyl chloride.

FIGS. 11a through 11d illustrate a sequence of steps for carrying out recording using such an information recording member. In the first place, as shown in FIG. 11a, using a corona charging unit 56, the surface of thermoplastic resin layer 55 is uniformly charged to a predetermined polarity. Then, light having image information is irradiated onto the recording member from one side thereof. In the illustrated step of FIG. 11b, image exposure is carried out at the side where the thermoplastic resin layer 55 is provided. Then, as shown in FIG. 11c, the surface of thermoplastic resin layer 55 is again charged. Finally, as shown in FIG. 11d, current is passed through the transparent electrode film 53 to heat the recording member so that those portions of thermoplastic resin layer 55 which are higher in charge density become thinner due to stronger Coulomb forces, thereby forming a frosted image. The frosted image thus produced may be reproduced using a schlieren optical system.

If it is desired to erase the frosted image once created, it is only necessary to heat the recording member to a temperature slightly higher than the temperature used for development. When so heated, the charge pattern disappears and thus the thermoplastic resin layer 55 becomes flat again mainly due to surface tension. It should be readily understood that the transparent electrode film 53 of the present embodiment is formed by a reductive, transparent, and conductive film, which is similar in composition and method of manufacture to the transparent electrode film 2 of the previously described embodiment.

The present recording member may be applied to holographic memories and microphotographs advantageously.

Referring now to FIG. 12, there is shown an optical modulator constructed in accordance with a still further embodiment of the present invention. As shown in FIG. 12, the illustrated optical modulator has the structure of a Pockels type optical modulator and it includes an electrooptic crystal 57 which charges its index of refraction due to application of an electric field thereto. Such a material includes a ferroelectric perovskite type crystal, such as $LiNbO_3$ and $LiTaO_3$, KDP, ADP, or $KD_2PO_4$(DKDP). Transparent electrode films 58, 59 are provided on both surfaces of the electrooptic crystal 57 as electrically connected to a driver source 60. In front of and behind the electrooptic crystal 57 is disposed an input polarizer 61 and an output polarizer 62. The crystal 57 and the polarizers 61 and 62 are disposed with their planes oriented parallel to each other. The input polarizer 61 is so oriented with its axis of polarization rotated over 45° with respect to the main crystal axis X of the electrooptic crystal 57, and, similarly, the output polarizer 62 is oriented with its axis of polarization rotated over −45° with respect to the main axis X.

It is assumed here that an axis which is perpendicular to the main axis X and which defines a plane parallel to the plane of crystal 57 is designated by Y and the other axis which is perpendicular both to the axes X and Y is designated by Z and a rectangular coordinate thus defined is oriented as shown in FIG. 12. Under these conditions, let us examine what will happen when light is irradiated in the Z direction. If no electric field is applied across the crystal 57, since the polarization axes of both of the polarizers 61 and 62 are normal to each other, there is no transmitted light. On the other hand, when a voltage is applied between the transparent electrode films 58 and 59, the refractive indexes $n_1$ and $n_2$ of electrooptic crystal 57 in X and Y directions vary, whereby there is produced a phase difference of $P = (2\pi/\lambda).(n_1 - n_2).l$ where l indicates the thickness of crystal 57. Thus, the light transmitted through the crystal 57 exhibits elliptical polarization, and the light passed through the output polarizer 62 has an intensity $I = I_0 \sin^2(P/2)$, where $I_0$ is the light intensity of incident light. In this manner, light modulation takes place.

In the present embodiment, the transparent electrode films 58 and 59 are comprised of a reductive, transparent, and conductive film which is similar in composition and method of manufacture to the transparent electrode film 2 of the previously described embodiment. The illustrated optical modulator may be advantageously applied to optical switches, optical shutters, and display elements.

Figure 14:
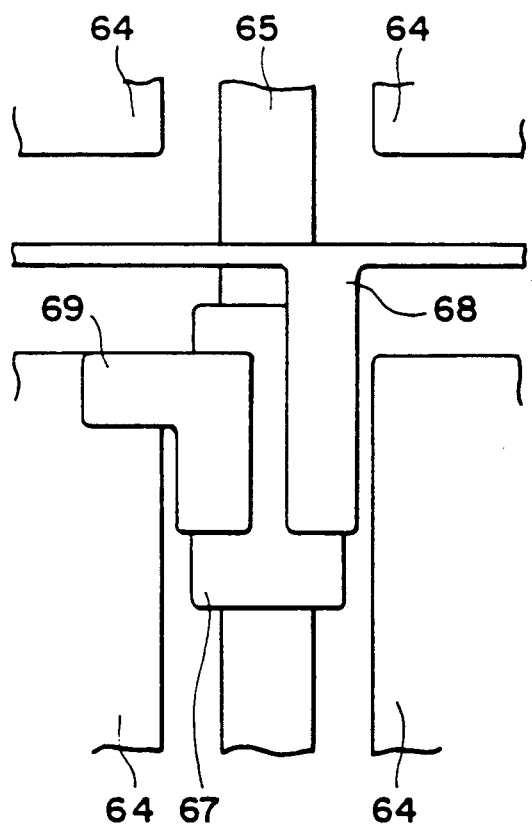
FIG. 14 is a plan view showing the structure of the device shown in FIG. 13 when viewed from above.

Referring now to FIGS. 13 and 14, there is shown a thin-film transistor (TFT) constructed with the application of the principle of the present invention. In forming the structure shown in FIGS. 13 and 14, a substrate 63 of glass or the like is first prepared and a transparent electrode film 64 is formed thereon, which is then etched into a desired pattern. Then, a gate electrode 65 of Cr (or Al) is formed on the substrate 63 using well-known deposition and etching techniques. Then, using the plasma CVD method, an insulating film 66 of $Si_3N_4$ or $SiO_2$ is formed. A semiconductor layer 67 is then formed from a-Si:H on the insulating layer 66 and the semiconductor layer 67 is partly etched away, thereby leaving a suitably patterned semiconductor layer 67. Finally, using suitable deposition and etching techniques, source and drain electrodes 68 and 69 are respectively formed from Al (or Cr). Such a thin-film transistor may be advantageously used, for example, in a liquid-crystal display panel. For this purpose, the transparent electrode film 64 is provided as connected to the drain electrode 69. As will be easily appreciated, the transparent electrode film 64 is comprised by a reductive, transparent, and conductive film, which is similar in composition and method of manufacture to the transparent electrode film 2 of the previously described embodiment.

In a prior art TFT, since use is made of a transparent electrode film of metal oxide, it is exposed to a reducing atmosphere during the formulation of a semiconductor film from an a-Si:H so that the electrode film tends to become reduced in electrical conductivity and deteriorated in electrical property. Besides, such a prior art electrode film tends to be chemically unstable and lacks uniformity so that there is more scatter as the density of the TFT is increased. Moreover, there is also a decrease in electrical conductivity originating from diffusion of alkali ions from the glass substrate 63.

It is true that the characteristics of a thin-film transistor are mainly determined by the thicknesses, materials, and geometrical parameters of insulating layer 66 and a-Si:H layer (semiconductor layer 67). Thus, as compared with the prior art, assuming that the devices have been manufactured by substantially the same manufacturing methods, the TFT devices according to the present invention have the following advantages. In the first place, the present invention is higher in the drain current $I_0$-to-gate voltage $V_G$ ON/OFF ratio. There is a very little difference in operating characteristic among elements and thus a uniform operating characteristic may be obtained even when manufactured at a high integration. Furthermore, the operating characteristic is not adversely affected due to aging and thus it is excellent in durability.

Figure 15:
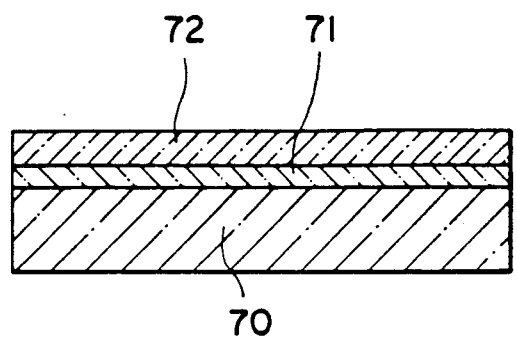
FIG. 15 is a schematic illustration showing a thermoelectric converting element embodying the present invention.

Referring now to FIG. 15, there is shown a thermoelectric conversion element which is constructed in accordance with one embodiment of the present invention. FIG. 15 shows the structure of a thermoplastic conversion element provided with a transparent heat-producing element and it includes a transparent substrate 70 of glass or the like, a transparent, heat-producing layer 71 formed on the substrate 70 and a transparent protective layer 72. Here, the transparent protective layer 72 may be preferably comprised of an inorganic material, such as $SiO_2$ and $TiO_2$, or a heat-resistant high polymer material, such as polyimide, polyimideamide, and polydiphenylether, but it may also be comprised of a polyester family resin if the temperature used is not so high.

With this structure, when current is caused to flow through the transparent heat-producing layer 71 as connected to a source of electric current, heat is produced due to Joule heating. And, thus, by controlling the level of current caused to flow, this may be used as a heat source to provide a desired level of heat. Here, the transparent heat-producing layer 71 is preferably comprised of a reductive, transparent, and conductive film which is similar in composition and method of manufacture to the transparent electrode film 2 of the previously described embodiment. In a typical prior art heat-producing element including transparent metal oxide, the electrical conductivity decreases gradually and the thermoelectric conversion efficiency also deteriorates gradually mainly due to diffusion of alkali ions. In particular, due to local irregularities in electrical conductivity, the thermoelectric conversion characteristic becomes appreciably non-uniform when formed to have a larger surface. On the other hand, in accordance with the present invention, since the transparent heat-producing layer 71 is stable in electrical conductivity and light transmissivity for an extended period of time, the thermoelectric conversion characteristic is stable and provides an excellent visibility. Moreover, even if fabricated to have a larger surface, uniformity in characteristic may be secured.

The illustrated thermoelectric conversion element may be advantageously used as mirrors and lenses in various types of office automation devices for prevention of formation of mist or dew on the surface, as refrigerator housings for preventing the formation of dew thereon, and as defrosters for automobiles. In the case where the present structure is to be applied to the surface of a mirror or lens, such a mirror or lens may be employed as a substrate and the transparent heat-producing layer 71 may be formed directly thereon.

Figure 16:
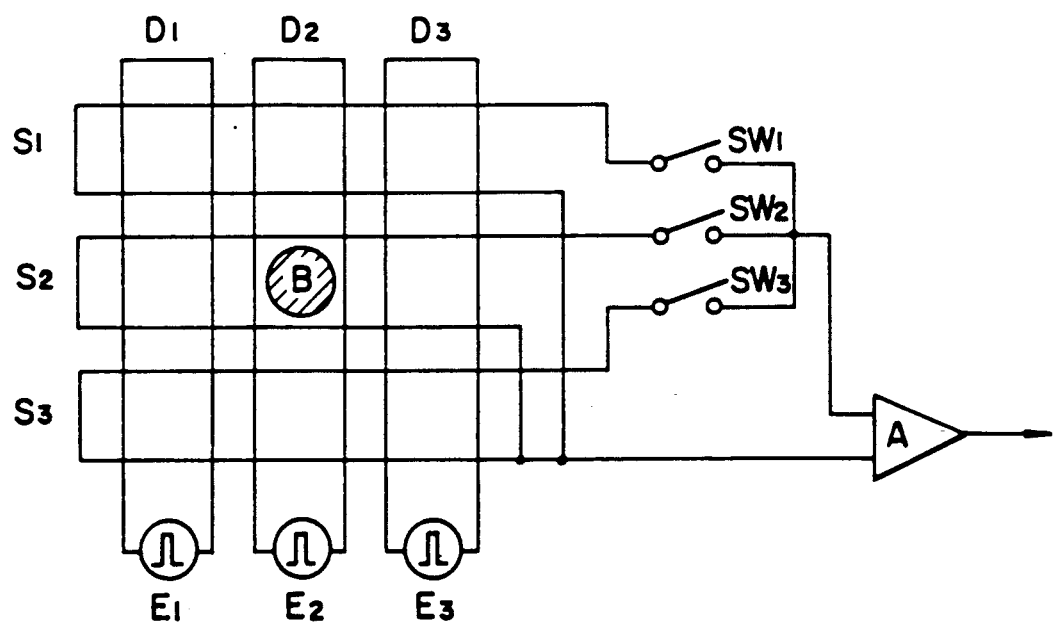
FIG. 16 is a schematic illustration showing in principle the electrical structure of an information inputting unit embodying the present invention.
Figure 17:
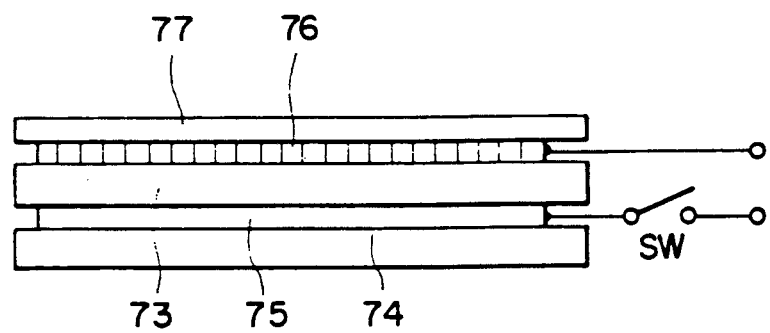
FIG. 17 is a schematic illustration showing the hardware structure of the device shown in FIG. 16.

Referring now to FIGS. 16 and 17, there is shown a tablet type information input device which is constructed in accordance with a still further embodiment of the present invention. FIG. 16 schematically shows the detecting principle of the present invention input device of the electromagnetic induction type. Let us suppose that an indicator pen provided with a permanent magnet or electromagnet at its tip end as incorporated therein is positioned with its tip end located at a position B. While current pulses are supplied to drive coils $D_1$ through $D_3$ in a sequential manner, switches $SW_1$ through $SW_3$ connected to respective sense coils $S_1$ through $S_3$ are closed for a short period of time also in a sequential manner. Timing of operation of each of the switches is such that the switch $SW_1$ is maintained closed until a current pulse is applied to each of the drive coils $D_1$ through $D_3$, and the switches $SW_2$ and $SW_3$ are similarly operated, and this sequence of operation is repetitively carried out. Thus, under the illustrated condition, only when a current pulse passes through the drive coil $D_2$ with the switch $SW_2$ being closed, an electromotive force is generated in the sense coil $S_2$ by electromagnetic induction, which is then amplified by an amplifier circuit A and transferred to a signal processing circuit (not shown), whereby the position B may be detected as a cross point between the drive coil $D_2$ and the sense coil $S_2$.

FIG. 17 illustrates a hardware structure which can carry out the detecting function shown in FIG. 16, and it includes substrates 73 and 74 of insulating material, such a glass, and transparent electrode films 75 and 76 formed in a desired pattern thereby defining drive and sense coils. Each of the coils thus defined has a density in a range of 0.5 to 5 loops/mm. On the transparent electrode film 75 is formed a transparent protective layer 77. In the illustrated embodiment, the transparent electrode films 75 and 76 defining the drive and sense coils, respectively, are each comprised of a reductive, transparent, and conductive film which is similar in composition and method of manufacture to the transparent electrode film 2 of the previously described embodiment.

In a prior art device, since use is made of a transparent electrode film of metal oxide, there occurs a deterioration in electrical conductivity, which then causes a deterioration in the accuracy of detecting an intended position. Moreover, the prior art structure tends to cause local irregularities in electrical conductivity, so that scatter tends to be present in input characteristic when the information input surface is made larger in area. Moreover, since the electrical conductivity is at most on the order of $10^4$ ohms.$cm^{-1}$, the detecting accuracy also tends to be deteriorated when made larger in surface area. On the other hand, in the present illustrated embodiment, since the transparent electrodes 75 and 76 can offer stable characteristics for an extended period of time and no reduction in electrical conductivity occurs, stable position detection and input characteristics can be expected at all times. Besides, even if the input screen is made larger in area, there will be produced virtually no scatter in input characteristic. It is to be noted that although the illustrated embodiment has been described as an electromagnetic induction type device, the present invention is equally applicable to an electrostatic capacitance type device, in which an intended position is detected by measuring charging current flowing into a capacitor defined by the indicator pen and the transparent electrode film.

Since the information input device illustrated in FIG. 17 is comprised of structural elements which all allow transmission of light, it may be provided as a unit formed on a CRT display device, electroluminescent display device, or liquid-crystal display device. Thus, the illustrated embodiment may be advantageously applied to data input terminals of computer systems and word processor systems.

Figure 18:
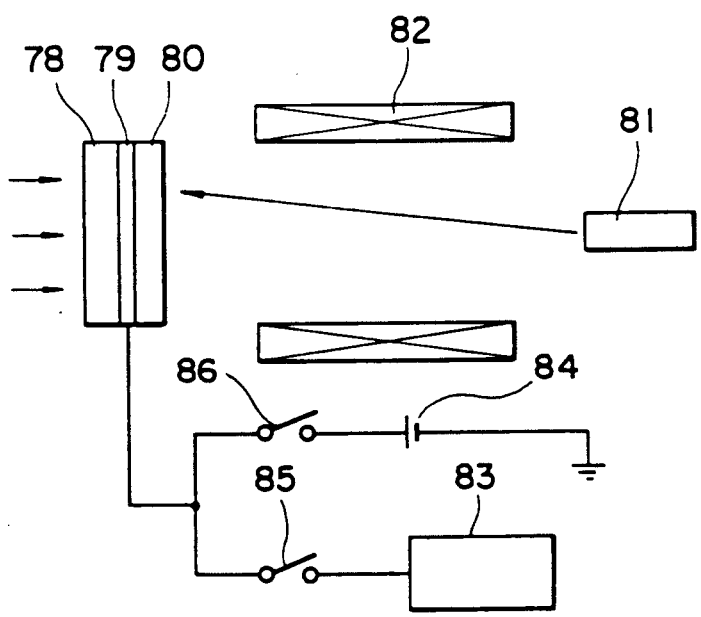
FIG. 18 is a schematic illustration showing a photoelectric converting device embodying the present invention.
Figure 19:
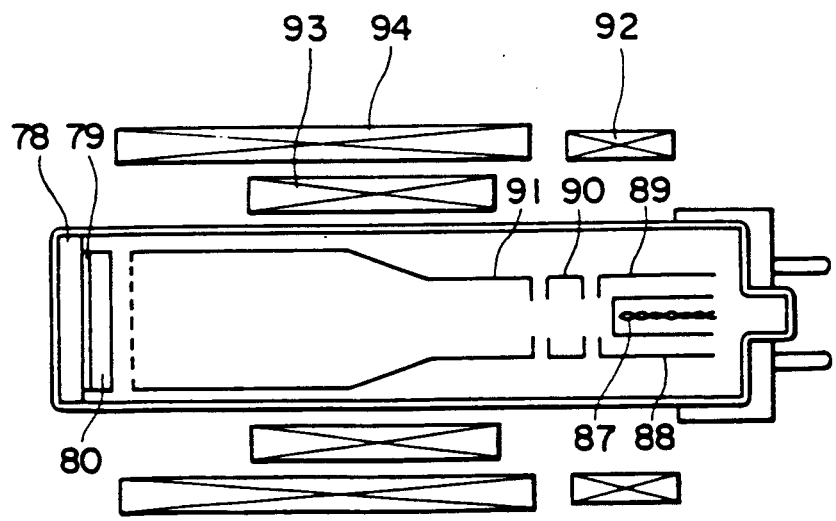
FIG. 19 is a schematic illustration showing a camera tube embodying the present invention.

Referring now to FIGS. 18 and 19, there is shown a photoelectric conversion element which is constructed in accordance with a still further embodiment of the present invention. FIG. 18 shows the principle of this embodiment, and, as shown, on a light-transmitting substrate 78 of glass or the like is formed signal electrodes 79 in a desired pattern, each defining a picture element, and a photoconductive layer 80 is formed on the substrate 79 at its opposite or back surface. Here, the signal electrodes 79 are comprised of a transparent and electrical conductive material. The photoconductive layer 80 is preferably comprised of a material, such as $Sb_2S_3$, PbO, CdSe, or a-Si:H. Also provided as shown in FIG. 18 are an electron gun 81, deflection coil 82, control circuit 83, power source 84, and switches 85 and 86.

In operation, when light having image information is irradiated from the side where the transparent substrate 78 is provided while applying a voltage on the order of several tens of volts to the signal electrodes 79 with the switch 86 open and switch 85 closed, electron-hole pairs are produced in the photoconductive layer 80 depending on the local intensity of light impinged thereon, so that the electrons move toward the signal electrodes 79 while the holes move toward the back side (electron beam scanning surface) of photoconductive layer 80. As a result, charge is accumulated at the back side of photoconductive layer 80 whose amount varies depending on the intensity of light impinged thereon.

Then, when the back side surface of photoconductive layer 80 is scanned by an electron beam emitted from an electron gun 81 with the switch 85 closed and switch 86 open, the electron beam flows into the photoconductive layer 80 depending on the level of surface potential at its scanning surface and this current may be picked up by the corresponding signal electrodes 79 for transfer to the control circuit 83.

In the embodiment illustrated in FIG. 18, the signal electrodes 79 are formed from a reductive, transparent, and conductive film which is similar in composition and method of manufacture to the transparent electrode film 2 of the previously described embodiment. Accordingly, as compared with a prior art structure using a transparent electrode film of metal oxide, the illustrated embodiment is chemically more stable, and, since there is no reduction in electrical conductivity irrespective of the kind of material forming the substrate, there may be obtained a stable photoelectric conversion characteristic for an extended period of time. Furthermore, no local irregularities in characteristic are created even if the device is made to have an enlarged surface area.

Referring now to FIG. 19, there is shown a television camera unit which is constructed using a photoelectric conversion element of the present invention. The camera unit includes a heater 87, a cathode 88, grids 89-91, arrangement coil 92, deflection coil 93 and convergent coil 94. The principle of operation of this unit is similar to that of the unit shown in FIG. 18.

Figure 20:
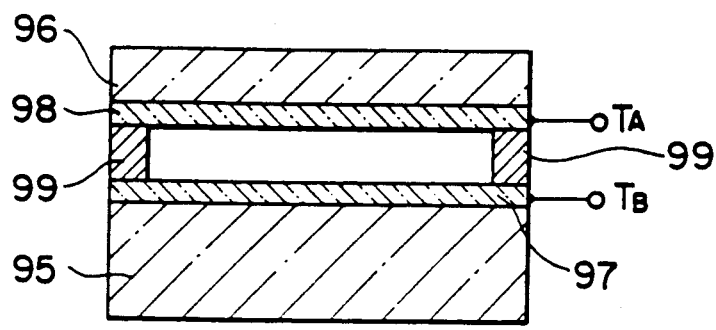
FIG. 20 is a schematic illustration showing a light transmission type switching element embodying the present invention.
Figure 21:
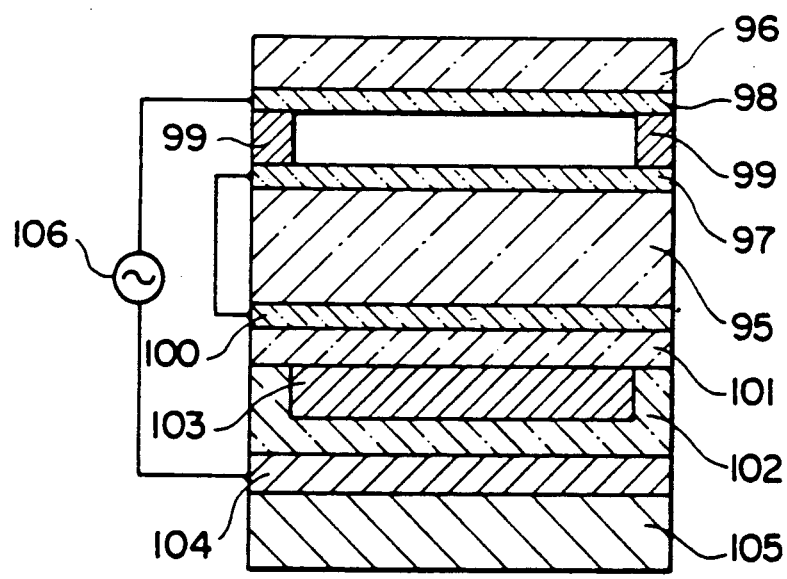
FIG. 21 is a schematic illustration showing a unit in which the optical switching element of FIG. 20 is combined with an electroluminescent element.

Referring now to FIGS. 20 and 21, there are shown light-transmitting type optical switching elements which are constructed in accordance with still further embodiments of the present invention. FIG. 20 shows the basic structure, and, as shown, transparent electrode films 97 and 98 are formed on a light-transmitting substrate 95 of glass or the like and another light-transmitting substrate 96 having flexibility, respectively, which are positioned opposite to each other with a spacer 99 sandwiched therebetween. The substrate 96 is preferably comprised of a film resin material, such as polyethylene and polyester.

In a light-transmitting type switching element thus constructed, when the flexible substrate 96 is depressed, for example, by a finger or the like, the transparent electrode films 97 and 98 are brought into contact so that terminals $T_A$ and $T_B$ are electrically connected, thereby establishing the ON condition of the switch. On the other hand, when the finger is released, the flexible substrate 96 returns to its original position by its own flexibility so that the films 97 and 98 are again separated from each other, thereby establishing the OFF state of the switch. Here, in the illustrated embodiment, each of the transparent electrode films 97 and 98 is preferably comprised of a reductive, transparent, and conductive film which is similar in composition and method of manufacture to the transparent electrode film 2 of the previously described embodiment.

With such a structure, as compared with a prior art device including a transparent electrode film of metal oxide, the present embodiment is chemically more stable and a stable switching characteristic may be expected for an extended period of time irrespective of the kind of substrate and use conditions. Moreover, since the transparent electrode films 97 and 98 are extremely low in resistance, a circuit having a small load impedance may also be used without problems. In addition, since the transparent electrode films 97 and 98 are uniform in electrical conductivity, there is virtually no scatter in characteristics among elements, so that it is suitable for application to larger-surfaced devices and provides excellent productivity.

FIG. 21 shows a modified structure which is constructed as a combination of the switching element shown in FIG. 20 with an electroluminescent element. As shown, the structure of FIG. 21 includes a transparent electrode film 100, which is similar in composition to each of the transparent electrode films 97 and 98. The illustrated structure also includes a pair of insulating films 101 and 102 and a light-emitting layer 103 sandwiched between the insulating layers 101 and 102. The light-emitting layer 103 contains ZnS as a main component and an additive, such as Mn, TbF$_3$, or SmF$_3$. An Al electrode 104 also serving as a reflector is provided as shown and a substrate 105 is provided on the Al electrode 104. A driving source 106 is provided connected as shown. With such a structure, when the deflectable substrate 96 is depressed, for example, by a finger, there is formed a closed circuit so that light may be emitted from the light-emitting layer 103 to the exterior. Accordingly, the illustrated optical switching element is particularly suited for use as an input device as superposed on a display unit or as an operating panel as superposed on various marks.

Figure 22:
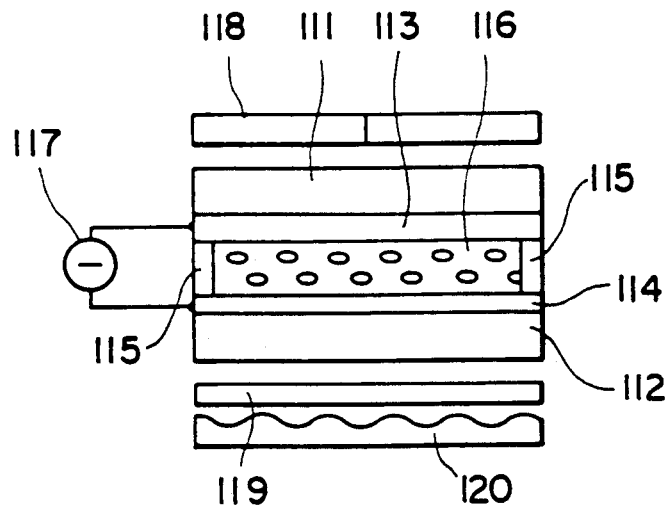
FIG. 22 is a schematic illustration showing a light reflecting type liquid-crystal optical device embodying the present invention.

FIG. 22 shows a reflecting type liquid crystal optical function element constructed in accordance with a still further embodiment of the present invention. The illustrated element includes a pair of glass substrates 111 and 112 which are formed with transparent electrode films 113 and 114 at their respective opposed surfaces. A sealed chamber is defined by placing a spacer 115 sandwiched between the transparent electrode films 113 and 114 and a liquid crystal is filled in the chamber to define a liquid crystal layer 116. Also provided is a driving power source 117 which is connected between the electrode films 113 and 114. A pair of polarizers 118 and 119 is disposed, one at the outer side of each of the corresponding glass substrates 111 and 112. A reflecting plate 120 is disposed at the bottom as shown.

With this structure, an electric field is applied across the liquid crystal layer 116 by applying a voltage between the transparent electrode films 113 and 114, and when reference light is directed through the liquid crystal layer 116 from the side where the polarizer 118 is provided, the light becomes modulated while passing through the liquid crystal layer 116 whereby the light is partly scattered and partly reflected by the reflecting plate 120 to pass through the polarizer 118 again to the exterior. As the liquid crystal, use may be made of any well-known material, such as nematic type liquid crystal compounds, cholesteric type liquid crystal compounds, and smectic type liquid crystal compounds.

In the present embodiment, each of the transparent electrode films 113 and 114 is formed from a reductive, transparent, and conductive film including a first element selected from a first group consisting of Sn, Pb, and In, C, at least one second element selected from a second group consisting of N, O, S and H, as mentioned previously with respect to the other embodiments. Accordingly, all of the advantages which can be obtained from the above-mentioned other embodiments can also be obtained in the present embodiment.

Figure 23:
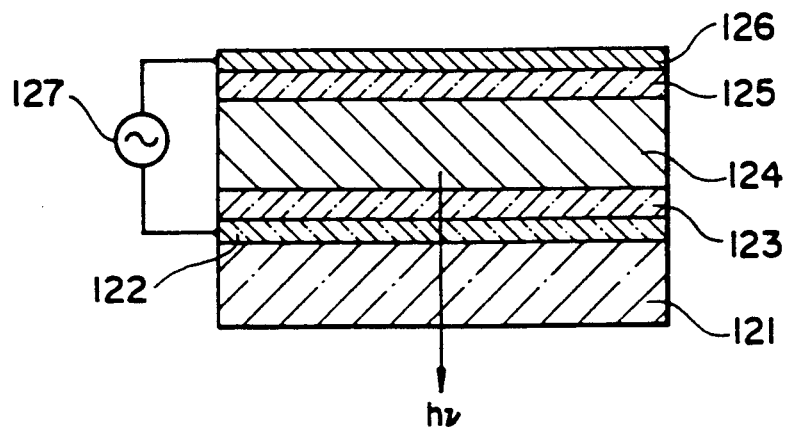
FIG. 23 is a schematic illustration showing a thin-film light-emitting element embodying the present invention.

FIG. 23 shows a thin-film light-emitting element, including an electroluminescent layer, which is constructed in accordance with a still further embodiment of the present invention. As shown, the present embodiment includes a glass substrate 121, an insulating layer 123, an electroluminescent layer 124, an insulating layer 125, and a metal electrode 126 of Al as formed on top of another in the order mentioned. The insulating layers 123 and 125 are typically comprised of Si$_3$N$_4$, and the light-emitting or electroluminescent layer 124 is formed from a-Si:C:H. With this structure, when an a.c. voltage is applied between the electrodes 122 and 126 by means of an a.c. voltage source 127, light is emitted from the electroluminescent layer 124 with the intensity depending on the electric field impressed across the layer 124.

Also in this embodiment, the transparent electrode film 122 is formed from a reductive, transparent, and conductive film. With such a structure, since the electrode film 122 is reductive in nature, alkali ions present in the glass substrate 121 are prevented from diffusing into the electrode film 122, so that the electrode film 122 does not suffer from a reduction in electrical conductivity even after long term use and it can maintain excellence in durability and resistance against changes of surrounding conditions. As a result, the present thin-film light-emitting element can provide an enhanced light-emitting efficiency and reliability. Furthermore, even if the element is fabricated to have an increased surface, there will be created no local irregularities in characteristic.

In the case where the insulating layers 123 and 125 are formed from Si$_3$N$_4$ and light-emitting layer 124 from a-Si:C:H as in the present embodiment, it is common practice to use the plasma CVD method to form these layers. Even so, since the transparent electrode film 122 is reductive in nature, no particular problems arise even if it is exposed to the reducing atmosphere by the plasma CVD method. Thus, very little diffusion of Sn, Pb, or In into the insulating layers 123 and 125 and light-emitting layer 124 takes place so that no deterioration in characteristic occurs.

Figure 24:
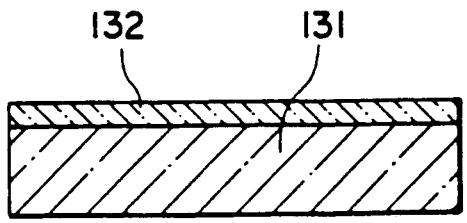
FIG. 24 is a schematic illustration showing a selective light transmission element embodying the present invention.

FIG. 24 illustrates a selective light transmitting element constructed in accordance with a still further embodiment of the present invention, which allows transmission of light having a specific wave length region and which is suitable for use in optical filters, heat flux reflectors, and transparent heat insulators. As shown, the present embodiment includes a substrate 131 and a transparent coating layer 132 formed thereon. The substrate 131 is formed from a material which allows transmission of light having a specific wave length region, preferably at least the visible light wave length region, such as glass and polyester. The transparent coating layer 132 is formed from a reductive, transparent, and conductive film including a first element selected from a first group consisting of Sn, Pb, and In, C, and at least one second element selected from a second group consisting of N, O, S, and H. In the present embodiment, the layer 132 is preferably formed to have a thickness ranging between 100 and 10,000 angstroms.

With such a selective light transmission element, the transmissivity in the visible light region is higher, e.g., 85% or more, as compared with a prior art element in which the coating layer 132 is formed from a thin-film of semiconductor oxide, and, thus, optical loss is minimized in the present embodiment. Besides, in the infrared light region, the present embodiment has a reflectivity of 90% or more, so that it can be used as an excellent transparent heat insulator. Furthermore, since the transparent coating layer 132 of the present embodiment can provide a uniform and excellent characteristic in electrical conductivity, debris and undesired foreign matter are not easily deposited even if it is used as a heat flux filter or heat mirror so that there is very little deterioration in the characteristic of selective light transmission. In addition, since the transparent coating layer 132 is reductive in nature, it is chemically stable and the optical characteristic does not become deteriorated over an extended period of time even under a reducing atmosphere, with the added advantage of capability to obtain uniformity in characteristic even when a larger-surfaced device is fabricated.

Similarly with the previous embodiments, the transparent coating layer 132 may be fabricated by any well-known film-forming technology and the preferred methods include CVD, plasma CVD, light-induced CVD, and reactive sputtering methods. Among these, the plasma CVD method is most preferred. In this case, organo-metallic compound, such as $Sn(CH_3)_4$, $Sn(C_2H_5)_4$, $Sn(C_3H_7)_4$, $Sn(OC_4H_9)_4$, $Sn(C_4H_9)_4$, $Pb(C_2H_5)_4$, $Pb(C_4H_9)_4$, $In(CH_3)_3$, $In(C_2H_5)_3$, $In(C_3H_7)_3$ and $In(C_4H_9)_3$, is diluted by introducing it into an appropriate carrier gas, such as He, Ar, $H_2$, and $N_2$, and, at the same time, at least one of a carbon containing gas, such as a hydrocarbon family gas exemplified by $CH_4$, $C_2H_6$, $C_3H_8$, $C_2H_4$ and $C_2H_2$, a nitrogen containing gas, such as $N_2$ and $NH_3$, a sulfur containing gas, such as $H_2S$, and an oxygen-containing gas, such as $O_2$, CO, $CO_2$, NO, $NO_2$, and $N_2O$, is selectively added. It is to be noted that here a hydride such as $Sn_xC_{1-x}$:H is assumed to be formed. In the case where the film contains an element selected from group IV, if it is desired to add an impurity, an impurity gas, such as $B_2H_6$, $AlCl_3$, $PH_3$, and $AsH_3$, is added by a regulated amount. On the other hand, if the film contains an element selected from group III, an impurity gas, such as $Zn(C_2H_5)_2$ and $Sn(CH_3)_4$, is added by a regulated amount.

While the above provides a full and complete disclosure of the preferred embodiments of the present invention, various modifications, alternate constructions and equivalents may be employed without departing from the true spirit and scope of the invention. Therefore, the above description and illustration should not be construed as limiting the scope of the invention, which is defined by the appended claims.

What is claimed is:

1. A reductive, transparent and electrically conductive film comprising C and a first element which is selected from the group consisting of Sn, Pb, In, and Tl, in proportions defined by $M_xC_z$, where M=Sn, Pb, In or Tl and $x+z=1$.

2. The film of claim 1, further comprising at least one element which is selected from the group consisting of H, O, N and S.

3. The film of claim 1, further comprising at least one additional element, wherein: (i) when said first element is selected from the group consisting of Sn and Pb, said at least one additional elements is an impurity selected from the group consisting of the elements B, Al, Ga, In, Tl, N, P, As, Sb, and Bi; but (ii) when said first element is selected from the group consisting of In and Tl, said at least one additional element is an impurity selected from the group consisting of the elements Zn, Cd, Hg, Si, Ge, Sn and Pb.

4. The film of claim 1, wherein said film consists essentially of a compound which is selected from the group consisting $Sn_xC_{1-x}$, $Sn_xC_yO_z$, $Sn_xC_yN_z$, $Sn_xC_yS_z$, $Pb_xC_{1-x}$, $Pb_xC_yO_z$, $Pb_xC_yN_z$, $Pb_xC_yS_z$, $In_xC_{1-x}$, $In_xC_yO_z$, $In_xC_yN_z$, and $In_xC_yS_z$, wherein x is more than zero but less than unity while satisfying $x+y+z=1$.

5. The film of claim 2, wherein said film consists essentially of a hydride which is selected from the group consisting of $Sn_xC_{1-x}$:H, $Sn_xC_yO$:H, $Sn_xC_yN_z$, $Sn_xC_yS_z$:H, $Pb_xC_{1-x}$:H, $Pb_xC_yO_z$:H, $Pb_xC_yN_z$:H, $Pb_xC_yS_z$:H, $In_xC_{1-x}$:H, $In_xC_yO_z$:H, $In_xC_yN_z$:H, and $In_xC_yS_z$:H, wherein x is more than zero but less than unity while satisfying $x+y+z=1$.

6. The film of claim 3 wherein said at least one additional element is added in a range between 1 ppm and 20 atomic %.

* * * * *